(12) United States Patent
Schmitt

(10) Patent No.: US 11,719,772 B2
(45) Date of Patent: Aug. 8, 2023

(54) AMR (XMR) SENSOR WITH INCREASED LINEAR RANGE

(71) Applicant: Analog Devices International Unlimited Company, Limerick (IE)

(72) Inventor: Jochen Schmitt, Biedenkopf (DE)

(73) Assignee: Analog Devices International Unlimited Company, Limerick (IE)

( * ) Notice: Subject to any disclaimer, the term of this patent is extended or adjusted under 35 U.S.C. 154(b) by 437 days.

(21) Appl. No.: 16/837,614

(22) Filed: Apr. 1, 2020

(65) Prior Publication Data

US 2021/0311141 A1 Oct. 7, 2021

(51) Int. Cl.
*G01R 33/09* (2006.01)
*H10N 50/80* (2023.01)
*H10N 50/85* (2023.01)

(52) U.S. Cl.
CPC .......... *G01R 33/096* (2013.01); *H10N 50/80* (2023.02); *H10N 50/85* (2023.02)

(58) Field of Classification Search
CPC .... G01R 33/096; G01R 33/09; G01R 33/091; G01R 33/093; G01R 33/095; G01R 33/098; G01R 33/06; G01R 33/02; G01R 33/0017; G01R 33/0005; G01R 33/0011; G01R 27/02; G01R 33/0052; G01R 33/0206; H01L 43/02; H01L 43/10; G01D 5/145; G01D 5/16
See application file for complete search history.

(56) References Cited

U.S. PATENT DOCUMENTS

| 4,425,593 | A | 1/1984 | Postma |
| 5,452,163 | A | 9/1995 | Coffey et al. |
| 6,222,361 | B1* | 4/2001 | Shimano ................ G01R 33/09 324/252 |
| 6,850,057 | B2* | 2/2005 | Witcraft ................ G01R 33/09 324/252 |
| 7,265,948 | B2 | 9/2007 | Hoshiya et al. |
| 7,589,939 | B2 | 9/2009 | Wakui et al. |
| 7,847,542 | B2 | 12/2010 | Bartos et al. |
| 8,207,732 | B2 | 6/2012 | Bartos et al. |

(Continued)

FOREIGN PATENT DOCUMENTS

| DE | 3507665 A1 | 9/1986 |
| DE | 260773 A1 | 10/1988 |

(Continued)

OTHER PUBLICATIONS

Extended European Search Report for European Application No. 21165525.3 dated Aug. 31, 2021.

(Continued)

*Primary Examiner* — Lee E Rodak
(74) *Attorney, Agent, or Firm* — Wolf, Greenfield & Sacks, P.C.

(57) ABSTRACT

Anisotropic-magnetoresistive (AMR) sensors are described. The AMR sensors have a barber pole structure with multiple constant width sections of different width. In some embodiments, two sections of greater, constant width are positioned at ends of the AMR sensor, with a section of smaller width positioned in between. The sections of greater width may have a total length less than the section of smaller width. The structures described may provide enhanced linearity.

20 Claims, 4 Drawing Sheets

(56) References Cited

U.S. PATENT DOCUMENTS

| | | |
|---|---|---|
| 8,749,232 B2 | 6/2014 | Fu et al. |
| 8,981,773 B2 | 3/2015 | Pozzati et al. |
| 9,618,589 B2 | 4/2017 | Zimmer et al. |
| 9,903,900 B2 | 2/2018 | Tsujimoto |
| 9,945,913 B2 | 4/2018 | Ide et al. |
| 10,317,480 B2 | 6/2019 | Raberg et al. |
| 2010/0033175 A1 | 2/2010 | Boeve et al. |
| 2010/0134095 A1 | 6/2010 | Loreit et al. |
| 2010/0264905 A1 | 10/2010 | Schmitt |
| 2011/0074399 A1 | 3/2011 | Bartos et al. |
| 2012/0019240 A1 | 1/2012 | Müller et al. |
| 2012/0262164 A1 | 10/2012 | Bartos et al. |
| 2012/0268113 A1 | 10/2012 | Sato et al. |
| 2015/0323568 A1 | 11/2015 | Schmitt |
| 2016/0146907 A1 | 5/2016 | Grimm et al. |
| 2016/0169985 A1 | 6/2016 | Weber et al. |
| 2017/0115363 A1 | 4/2017 | Jiang et al. |
| 2017/0276740 A1 | 9/2017 | Schmitt et al. |
| 2018/0348311 A1 | 12/2018 | Voss et al. |

FOREIGN PATENT DOCUMENTS

| | | | |
|---|---|---|---|
| DE | 4314539 A1 | 11/1994 | |
| DE | 43 35 826 A1 | 4/1995 | |
| DE | 10342260 A1 | 4/2005 | |
| DE | 102012208404 A1 * | 11/2013 | ......... G01R 33/0005 |
| EP | 2 671 091 B1 | 12/2013 | |
| WO | WO-2018116743 A1 * | 6/2018 | ............. G01R 33/09 |

OTHER PUBLICATIONS

Jander et al., Magnetoresistive Sensors for Nondestructive Evaluation. 10$^{th}$ SPIE International Sympsoium. Nondestructive Evaluation for Health Monitoring and Diagnostics, Conference 5770, 2005; 13 pages.

* cited by examiner

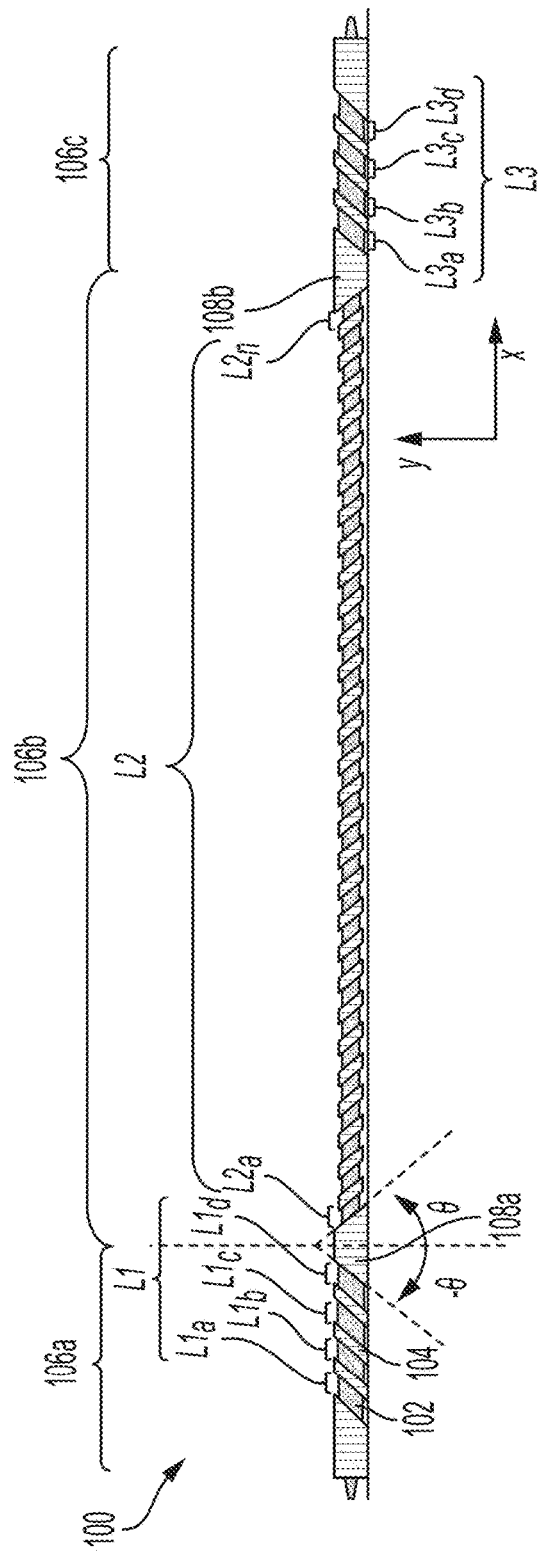
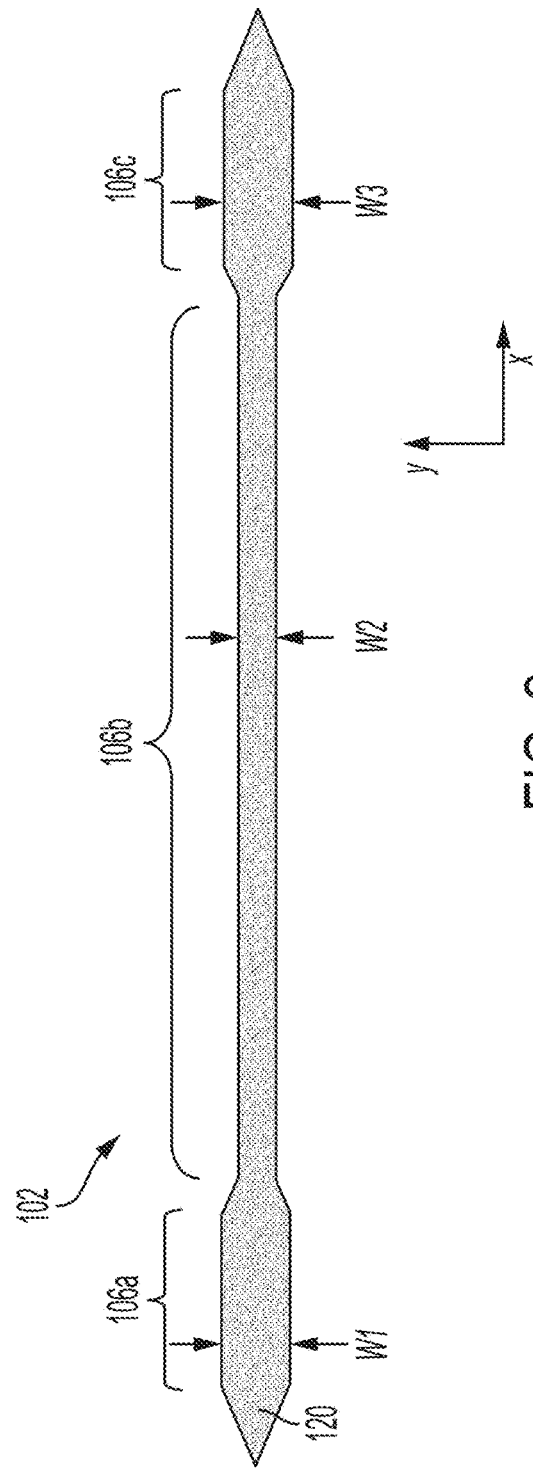
FIG. 1
FIG. 2

AMR (XMR) SENSOR WITH INCREASED LINEAR RANGE

FIELD OF THE DISCLOSURE

The present application relates to magnetic field sensors.

BACKGROUND

Anisotropic-magnetoresistive (AMR) sensors are used to sense magnetic fields by detecting a change in resistance of the sensor as a result of the magnetic field. Some AMR sensors have a so-called "barber pole" structure, with a resistive strip that has conductive strips arranged thereon in a pattern resembling a barber pole.

SUMMARY OF THE DISCLOSURE

Anisotropic-magnetoresistive (AMR) sensors are described. The AMR sensors have a barber pole structure with multiple constant width sections of different width. In some embodiments, two sections of greater, constant width are positioned at ends of the AMR sensor, with a section of smaller width positioned in between. The sections of greater width may have a total length less than the section of smaller width. The structures described may provide enhanced linearity.

According to some embodiments, an anisotropic-magnetoresistive (AMR) sensor with improved linearity is provided, comprising: a strip of magneto resistive material, the strip comprising a first section having a first constant width and a second section having a second constant width greater than the first constant width; a first plurality of conductive strips arranged on the first section and oriented at a first angle relative to the strip of magneto resistive material; and a second plurality of conductive strips arranged on the second section and oriented at a second angle relative to the strip of magneto resistive material.

According to some embodiments, an anisotropic-magnetoresistive (AMR) sensor with improved linearity is provided, comprising: a continuous strip of magneto resistive material having first and second barber pole portions, the first barber pole portion having a first width and a first conductive strip angle and the second barber pole portion having a second width different than the first width and a second conductive strip angle different than the first conductive strip angle.

According to some embodiments, an anisotropic-magnetoresistive (AMR) sensor with improved linearity is provided, comprising an input signal terminal; an output signal terminal; and coupled between the input signal terminal and output signal terminal, means for providing a linear change in resistance as a function of applied external magnetic field by superimposing a positive change in resistance as a function of the applied external magnetic field and a negative change in resistance as a function of the applied external magnetic field.

BRIEF DESCRIPTION OF DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

FIG. 1 illustrates an anisotropic-magnetoresistive (AMR) sensor according to a non-limiting embodiment of the present application, having multiple sections of different constant width.

FIG. 2 illustrates the resistive strip of FIG. 1.

DETAILED DESCRIPTION

Figure 3A:
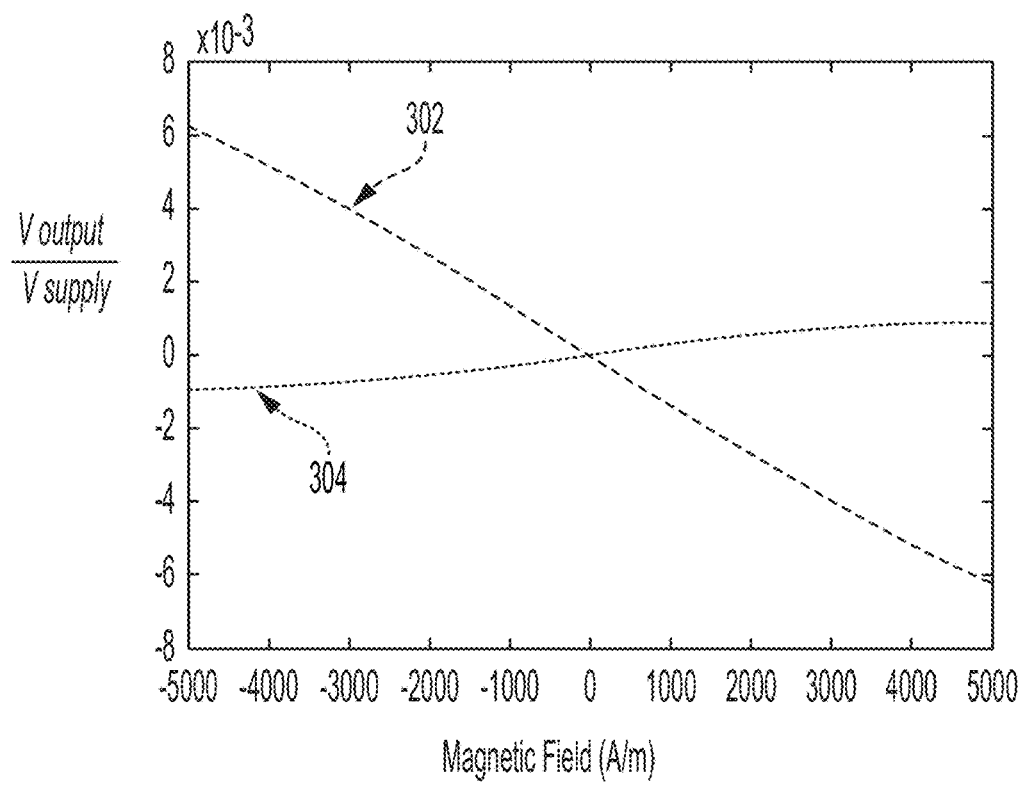
FIG. 3A is a graph illustrating the response of two separate constant width portions of an AMR sensor of the types described herein.

According to an aspect of the present application, an anisotropic-magnetoresistive (AMR) sensor is provided exhibiting a high degree of linearity. The linearity refers to the changes in resistance as a function of magnetization. The AMR sensor may include a resistive strip with different constant width sections. Conductive strips on the resistive strip may be positioned at different angles relative to each other depending on which constant width section they overlie. In some embodiments, the conductive strips on a wider section of the resistive strip may be at an opposite angle relative to the conductive strips on a narrower section of the resistive strip.

FIG. 1 illustrates an anisotropic-magnetoresistive (AMR) sensor according to a non-limiting embodiment of the present application, having multiple segments or sections of different constant width. The AMR sensor 100 comprises a resistive strip 102 and a plurality of conductive strips 104. The AMR sensor 100 exhibits a first section 106a, second section 106b, and third section 106c.

As shown in FIG. 2, the resistive strip 102 is a continuous strip having different widths, shown here as W1, W2, and W3. Specifically, section 106a has a width W1, section 106b has a width W2, and section 106c has a width W3. The width is oriented along the y-axis in this example. Referring back to FIG. 1, the resistive sections of section 106a have a combined length L1 representing the sum of the lengths $L1_a$, $L1_b$, $L1_c$, and $L1_d$, which are the portions of the resistive strip 102 between the conductive strips 104 in the section 106a. The resistive sections of section 106b have a combined length L2, representing the sum of the lengths $L2_a \ldots L2_n$, which are the portions of the resistive strip 102 between the conductive strips 104 in the section 106b. The resistive sections of section 106c have a combined length L3, representing the sum of the lengths $L3_a$, $L3_b$, $L3_c$, and $L3_d$, which are the portions of the resistive strip 102 between the conductive strips 104 in the section 106c.

The widths W1, W2, and W3 are constant widths over the respective length of that section. That is, W1 is constant over the length L1, W2 is constant over the length L2, and W3 is constant over the length L3. The widths W1 and W3 are greater than W2. In some embodiments, W1 and W3 are equal. W1 and W3 may be greater than W2 by a factor between 1.1 and 2.5. That is, the ratio of the width of the W1 (and likewise W3) to the width W2 may be between 1.1 and 2.5, including any value within that range. Stated another way, W1 (and likewise W3) may be between 10% greater than W1 and 150% greater than W1. Both W1 and W2 may be in the range of 1 micron to 20 microns in some embodiments. Having W1 and W3 larger than W2 can facilitate magnetizing the AMR sensor 100. Typically a magnetizing field is applied at one on more ends of an AMR sensor. Sections of greater width are easier to magnetize. Magnetization can travel along the length of the sensor. Therefore, making the ends easier to magnetize by making them wider may facilitate the magnetization process.

The fact that widths W1, W2, and W3 are constant means that the current through the resistive strip portions of the sections 106a, 106b, and 106c is in same direction. In the example of FIG. 2, the current through those sections will move in the x-direction. Having the current moving in the same direction through sections 106a, 106b, and 106c may facilitate achieving the enhanced linear magnetic field response provided by the AMR sensor 100.

The lengths L1, L2, and L3 may assume any suitable values for providing desired magnetization, as described further below. In some embodiments, L1 and L3 may be equal, though not all embodiments are limited in this respect. In some embodiments, the total length of L1 plus L3 may be less than L2. For example, the ratio of L2 over (L1+L3) may be between 1.2 and 40, including any value within that range. The total length of a resistive strip, such as resistive strip 102, may be in the range of 50 µm up to 1000 µm long, in some non-limiting embodiments.

FIG. 2 also illustrates how the resistive strip 102 has a tapered end 120. In fact, in the illustrated example, the resistive strip 102 has a tapered end adjacent section 106a and a tapered end adjacent section 106c. The tapered ends may facilitate the magnetization stability of the resistive strip.

Returning to FIG. 1, it can be seen that the conductive strips 104 are oriented at different angles depending on which section they are a part of. That is, the conductive strips of section 106a are oriented at one angle, and the conductive strips of section 106b at another. In the non-limiting example illustrated, the conductive strips of section 106a are oriented at an opposite angle to those of section 106b, relative to a line in-plane with and perpendicular to the resistive strip 102. Thus, for purposes of illustration, the conductive strips of section 106b may be said to be oriented at an angle Θ, while the conductive strips of section 106a may be said to be oriented at −Θ. The value of Θ may be any suitable value to provide a desired level of linearization of the magnetic response of the AMR sensor. As a non-limiting example, Θ may assume any value in a range from 30 degrees to 60 degrees.

It should be appreciated from FIG. 1 that the AMR sensor 100 comprises multiple barber pole portions. Section 106a may represent a first barber pole portion, section 106b a second barber pole portion, and section 106c a third barber pole portion. The barber pole portions may represent portions of the continuous AMR sensor that differ in some way in their width and/or conductive strip configuration from a neighboring portion.

Figure 3B:
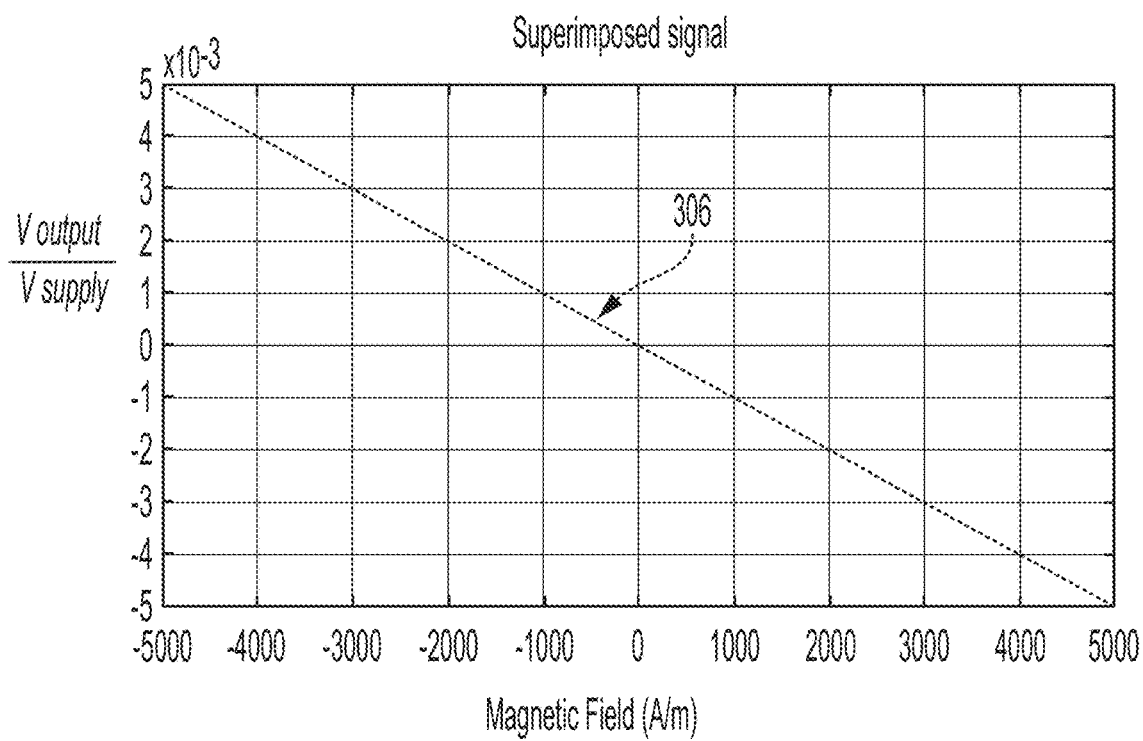
FIG. 3B is a graph illustrating the overall response of the AMR sensor illustrated in FIG. 4A.

The AMR sensor 100 may exhibit enhanced linearity compared to conventional AMR sensors. The magnetic response of a barber pole AMR sensor depends on both the width of the sensor and the angle of the conductive strips. For an AMR sensor with a constant width and a single conductive strip angle, the response is typically non-linear. Flipping the angle of the conductive strips from a positive angle to a negative angle (or vice versa) changes the slope of the response curve from positive to negative (or vice versa). The inventor has appreciated that having a multi-section AMR sensor where one section has a positive slope response and another section has a negative slope response may facilitate achieving a more linear response curve. FIGS. 3A and 3B illustrate a non-limiting example.

FIG. 3A is a graph illustrating a simulated response curve for two sections of an AMR sensor. The x-axis represents magnetic field in units of Amperes per meter (A/m), and the y-axis represents the ratio between the output voltage ($V_{output}$) of the sensor and the supply voltage ($V_{supply}$) applied to the sensor. Curve 302 represents the response curve of a narrower constant width section of an AMR sensor, having a positive relative angle of conductive strips. Curve 304 represents the response curve of a greater constant width section of the AMR sensor, having a negative relative angle of conductive strips. For example, curve 302 may represent the response of section 106b of AMR sensor 100, while curve 304 may represent the response of section 106a of AMR sensor 100. As can be seen in FIG. 3A, curve 302 may exhibit a negative slope, while curve 304 exhibits a positive slope. The magnitude of the slopes differs, however, with curve 304 exhibiting a smaller absolute slope.

FIG. 3B illustrates the results of superimposing the curves 302 and 304 of FIG. 3A. The x-axis represents the magnetic field in units of A/m, and the y-axis represents Voutput/Vsupply, as with FIG. 3A. As shown, the curve 306—representing the combination of curves 302 and 304—exhibits a highly linear response. The positive-going curve 304 serves to remove some of the non-linear behavior of the AMR sensor, contributing to a linear overall response.

It should be appreciated from FIGS. 3A and 3B that a multi-section AMR sensor of the types described herein, for example as illustrated in FIG. 1, may exhibit a highly linear response in the presence of a magnetic field. The relative widths of the constant width sections may be selected to provide a desired degree of linear response.

Moreover, it should be appreciated that according to an aspect of the present application, the inventor has recognized that it is desirable to generate two separate magnetic response regions with an AMR sensor, and to superimpose the magnetic responses of those regions to create a more linear overall response. To do this, it is desirable that the magnetic response of a first region of the AMR sensor exhibits its peak resistance change (DeltaR/R) over a smaller external magnetic field range than the second region of the AMR sensor, as shown in FIG. 3A.

Returning to FIG. 1, the conductive strips 104 fully cover the transition regions 108a and 108b, which transition from the section 106a to 106b and from 106b to 106c, respectively. The transitions regions represents the transition between the wider constant width section and the narrower constant width section. Fully covering these transition regions with conductive strips ensures proper behavior of the AMR sensor.

The resistive strip 102 and conductive strips 104 may be made of any suitable materials. The resistive strip 102 may be a magneto resistive material, for example formed of permalloy, which is a NiFe alloy. Other alloys may alternatively be used, such as alloys containing Ni, Fe, or Co (e.g., a CoFe alloy). The conductive strips 104 may be formed of Al, Au, Cu, or metal alloys, such as AlCu.

Figure 4:
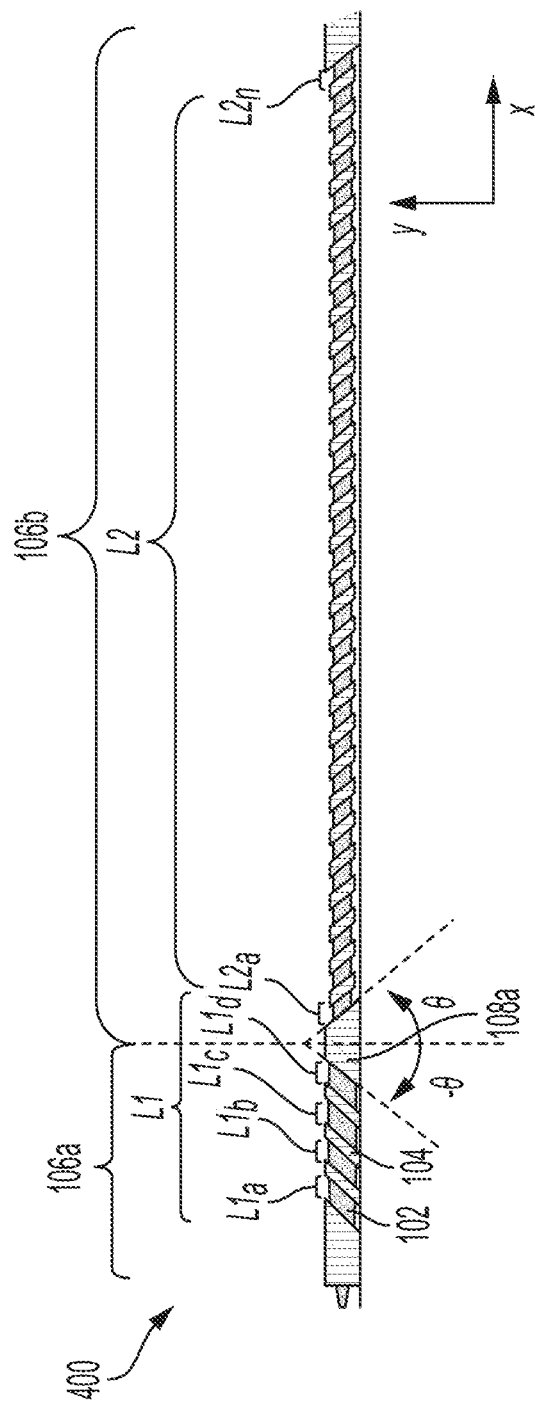
FIG. 4 illustrates an AMR sensor according to a non-limiting embodiment of the present application, having multiple sections of different constant widths.

While FIG. 1 illustrates an AMR sensor having two ends of greater width than a middle section, alternatives are possible. For example, according to one alternative an AMR sensor has a single end of greater width than the remaining portion of the AMR sensor. For example, referring to FIG. 1, an alternative embodiment may omit section 106c entirely. FIG. 4 illustrates this example. The AMR sensor 400 is the same as the AMR sensor 100 of FIG. 1 except that the section 106c is omitted.

An aspect of the present application provides means for sensing a magnetic field. An aspect of the present application provides means for providing a linear response to magnetic field variation. The linear response may be a linear change in resistance, or a linear change in voltage. The linear response may be exhibited over a working range of the means. Some embodiments include means for providing a combined magnetic field response that is a superposition of a positive slope magnetic response and a negative slope magnetic response. In some embodiments, a magnetic field sensor is provided, including electrical contacts, and means for providing a linear response to a magnetic field. The linear response may be a linear change in resistance, or a linear change in voltage. The electrical contacts may be positioned to allow for making electrical connection to ends of the magnetic field sensor.

An aspect of the present application provides means for providing a linear change in resistance as a function of applied external magnetic field by superimposing a positive change in resistance as a function of the applied external magnetic field and a negative change in resistance as a function of the applied external magnetic field. An AMR sensor may include an input signal terminal, an output signal terminal, and the means, coupled between the input signal terminal and output signal terminal. The means may comprise means for providing a linear change in resistance as a function of applied external magnetic field by superimposing a positive change in resistance as a function of the applied external magnetic field and a negative change in resistance as a function of the applied external magnetic field, wherein a slope of the positive change in resistance as a function of applied external magnetic field has a different absolute value than a slope of the negative change in resistance as a function of applied external magnetic field.

Figure 5:
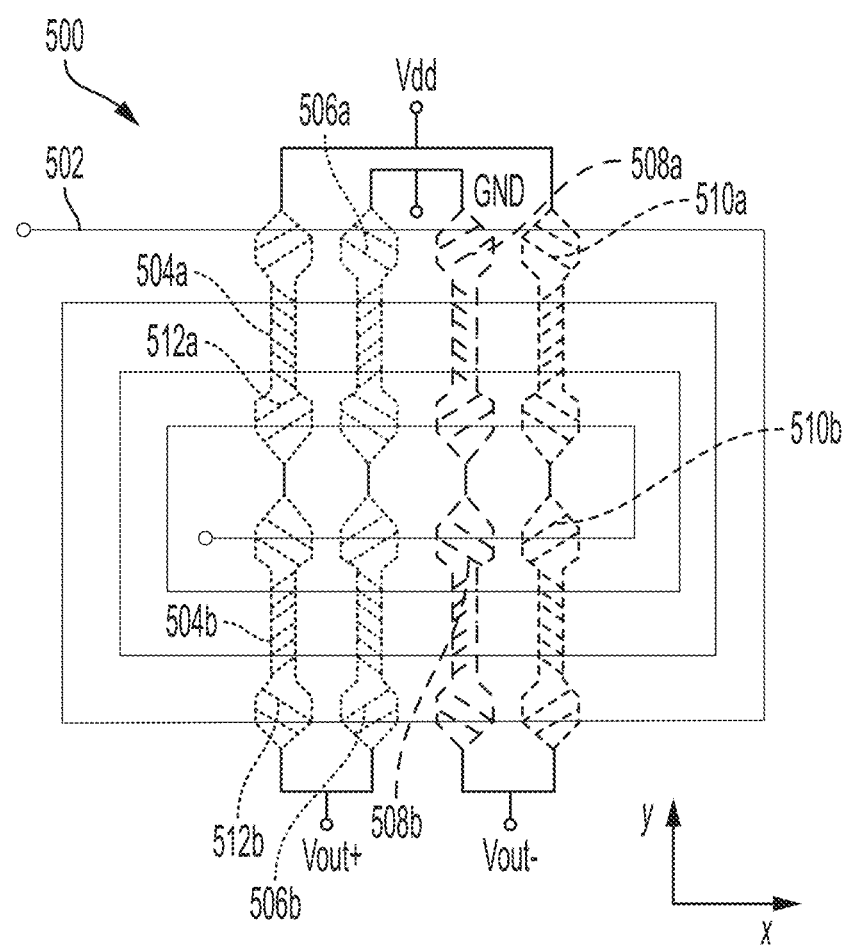
FIG. 5 illustrates a magnetic field sensor according to a non-limiting embodiment of the present application.

FIG. 5 illustrates a magnetic field sensor according to a non-limiting embodiment of the present application. The magnetic field sensor 500 comprises a coil 502 and a grouping of eight AMR sensors 504a, 504b, 506a, 506b, 508a, 508b, 510a and 510b, of the types described previously herein. A supply voltage Vdd is applied to the grouping of AMR sensors at an input signal terminal, and a differential output signal is taken as Vout+ and Vout− from an output signal terminal. One end of the grouping of AMR sensors is grounded (GND), as shown. Vdd and GND in combination may represent an input signal terminal.

The coil 502 may be used to magnetize the AMR sensors. The coil 502 overlies the AMR sensors in this non-limiting example, and may have any suitable structure. The illustrated shape is a non-limiting example. The coil 502 may be formed of any suitable conductive material. For example, a metallic trace on a printed circuit board (PCB) may be used, although alternatives are possible. In some embodiments, the coil 502 may be microfabricated.

The magnetizing field created by the coil 502 may point either in the positive y-direction or the negative y-direction depending on where a particular AMR sensor is positioned relative to the coil. Assuming again the coil 502 overlies the AMR sensors, then when electric current conducts clockwise through the coil 502, the magnetic field experienced by AMR sensors 504a, 506a, 508a and 510a may point in the positive y-direction, while the magnetic field experienced by AMR sensors 504b, 506b, 508b, and 510b may point in the negative y-direction. This may be said to represent a situation in which the magnetizing field points outward, towards the ends or edges of the grouping of AMR sensors. When electric current conducts counterclockwise through the coil 502, the magnetic field experienced by AMR sensors 504a, 506a, 508a, and 510a may point in the negative y-direction, while the magnetic field experienced by AMR sensors 504b, 506b, 508b, and 510b may point in the positive y-direction. This may be said to represent a situation in which the magnetizing field points inward, toward a center of the grouping of AMR sensors. As described earlier, wider sections of an AMR sensor may magnetize more easily than narrower sections. Thus, in the magnetic field sensor 500 the individual AMR sensors 504a, 504b, 506a, 506b, 508a, 508b, 510a, and 510b may magnetize from a wider region of the AMR sensor toward the center of the AMR sensor. The grouping of AMR sensors may be magnetized at various points during operation using the coil 502.

AMR sensors 504a, 504b, 506a, 506b, 508a, 508b, 510a, and 510b may be of the types described previously herein. For example, each may be an instance of the AMR sensor 100. As shown, the pairs of AMR sensors may exhibit opposing barber pole configurations, based on the angles of the conductive strips. For example, it can be seen that the angle of the conductive strips 512a of AMR sensor 504a is opposite to that of the angle of the conductive strips 512b of AMR sensor 504b with respect to the x-direction. More specifically, the angle of the conductive strips 512a at an end of the AMR sensor 504a is opposite to the angle of the conductive strips 512b at an end of the AMR sensor 504b, and the angle of the conductive strips 512a along a center segment of the AMR sensor 504a is opposite to the angle of the conductive strips 512b along a center segment of the AMR sensor 504b, relative to the x-direction. Likewise, AMR sensors 506a and 506b exhibit opposing barber pole configurations relative to each other, AMR sensors 508a and 508b exhibit opposing barber pole configurations relative to each other, and AMR sensors 510a and 510b exhibit opposing barber pole configurations relative to each other.

In operation, the magnetic field sensor 500 may be magnetized using the coil 502. A supply voltage Vdd may then be applied as shown, and the differential output signal Vout+, Vout− may be monitored. The supply voltage Vdd may assume any suitable value. When the magnetic field sensor 500 is exposed to an externally applied magnetic field, the group of AMR sensors of magnetic field sensor 500 may experience a change in resistance. The change in resistance may give rise to a change in the differential output signal Vout+, Vout−. The strength of the externally applied magnetic field may be determined from the change in the differential output signal Vout+, Vout−. As a non-limiting example, magnetizing the AMR sensors by running a current through the coil 502 in a clockwise direction, and then subjecting the magnetic field sensor 500 to an external field in the x-direction will cause the resistances of AMR sensors 504a, 504b, 508a, and 508b to increase, and the resistances of AMRs sensors 506a, 506b, 510a, and 510b to decrease. The resistances of AMR sensors 504a, 504b, 508a, and 508b increase in this example because of the angle between current flow in those resistors and the x-direction external magnetic field. By contrast, the current flow direction in the AMR sensors 506a, 506b, 510a, and 510b is different due to the opposite angle of the conductive strips of those AMR sensors, and thus the resistances of those AMR sensors decreases.

As has been described previously, aspects of the present application provide means for providing a linear change in resistance as a function of applied external magnetic field by superimposing a positive change in resistance as a function of the applied external magnetic field and a negative change in resistance as a function of the applied external magnetic field. It should be appreciated from FIG. 5 that in some embodiments according to such aspects, an AMR sensor comprising the above-described means comprises multiple barber-pole AMR sensors. In some embodiments, the means comprises multiple pairs of barber-pole AMR sensors having opposing barber pole configurations.

Magnetic field sensors according to aspects of the present application, such as magnetic field sensor 500, may be used in various settings to sense an external magnetic field. For example, magnetic field sensors may be used on industrial equipment to sense magnetic fields experienced by the equipment. Magnetic field sensors may be used on medical equipment, or in structural monitoring (such as monitoring of buildings or sensors on buildings). Magnetic field sensors may be used as compasses. Magnetic field sensors may be used as current sensors. Other uses are also possible.

It should be appreciated from FIG. 5 that an aspect of the present application provides a magnetic field sensor comprising two or more pairs of AMR sensors, where the AMR sensors within the pairs exhibit opposing barber pole configurations to each other. Each of the AMR sensors may have a section of wider, constant width and a section of narrower, constant width. In some embodiments, the ends of each AMR sensor have a wider, constant width than a central section of the AMR sensor.

Magnetic field sensors of different constructions than that of FIG. 5 are possible. For example, a magnetic field sensor may differ from magnetic field sensor 500 by omitting AMR sensors 504b, 506b, 508b, and 510b. A magnetic field sensor may differ from magnetic field sensor in including just AMR sensors 504a, 504b, 506a, and 506b. Such a configuration may be considered a half-bridge magnetic field sensor. Moreover, such a half-bridge magnetic field sensor may be magnetized in only a single direction by a magnetizing coil. Moreover, it should be appreciated that one or more of the AMR sensors of FIG. 5 may in practice be implemented as multiple barber pole AMR sensors connected in series.

Aspects of the present application may provide various benefits, some of which have been described. It should be appreciated that not every embodiment necessarily provides all benefits, and that benefits other than those listed may be provided. According to an aspect of the present application, an AMR sensors exhibiting enhanced linearity is provided. The AMR sensor may exhibit substantial linearity in its magnetic field response over a working range of magnetic fields. In some embodiments, the working range may encompass a range of magnetic fields up to 10,000 A/m, up to 5,000 A/m, or up to 2,000 A/m, although other ranges are possible. According to aspects of the present application, an AMR sensor is provided exhibiting enhanced ease of magnetization. The AMR sensor may have opposing ends of greater, constant width than a center section of the AMR sensor.

The terms "approximately", "substantially," and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. An anisotropic-magnetoresistive (AMR) sensor with improved linearity, comprising:
a continuous strip of magnetoresistive material, the strip comprising a first section having a first constant width and a second section having a second constant width greater than the first constant width, wherein the strip of magnetoresistive material is configured such that a supply voltage is applied to an input end of the second section, and wherein an output end of the second section is positioned between the input end of the second section and the first section;
a first plurality of conductive strips arranged on the first section and oriented at a first angle relative to the strip of magnetoresistive material, and extending over the first constant width; and
a second plurality of conductive strips arranged on the second section and oriented at a second angle relative to the strip of magnetoresistive material, and extending over the second constant width, wherein the first angle is opposite the second angle with respect to a line parallel to the first and second constant widths and perpendicular to a length of the strip of magnetoresistive material.

2. The AMR sensor of claim 1, wherein the first angle is between 30 and 60 degrees.

3. The AMR sensor of claim 1, wherein the strip of magnetoresistive material further comprises a third section having a third constant width greater than the first constant width and a third plurality of conductive strips oriented at a third angle relative to the strip of magnetoresistive material.

4. The AMR sensor of claim 3, wherein the second constant width and third constant width are substantially the same, and wherein the second angle and the third angle are substantially the same.

5. The AMR sensor of claim 3, wherein, the first section is between the second and third sections.

6. The AMR sensor of claim 3, wherein a combined length of resistive portions of the first section is between 1.2 and 40 times greater than a combined length of resistive portions of the second section and third section.

7. The AMR sensor of claim 1, wherein the strip of magnetoresistive material further comprises a third section of varying width connecting the first section and second section, and wherein the AMR sensor further comprises a conductive material covering the third section.

8. The AMR sensor of claim 1, further comprising a tapered end adjacent the second section.

9. An anisotropic-magnetoresistive (AMR) sensor with improved linearity, comprising:
a continuous strip of magnetoresistive material having first and second barber pole portions, the first barber pole portion having a first constant width and a first conductive strip angled at a first conductive strip angle and the second barber pole portion having a second constant width greater than the first width and a second conductive strip angled at a second conductive strip angle different than the first conductive strip angle, wherein the first conductive strip extends over the first constant width, the second conductive strip extends over the second constant width, the continuous strip of magnetoresistive material is configured such that a supply voltage is applied to an input end of the second barber pole portion, and wherein an output end of the second barber pole portion is positioned between the input end of the second barber pole portion and the first barber pole portion.

10. The AMR sensor of claim 9, wherein the first conductive strip angle is opposite the second conductive strip angle with respect to a line in-plane with the strip of magnetoresistive material and perpendicular with the strip of magnetoresistive material.

11. The AMR sensor of claim 9, wherein the AMR sensor further comprises a third barber pole portion having a third constant width greater than the first constant width and a third conductive strip angle different than the first conductive strip angle.

12. The AMR sensor of claim 11, wherein the second constant width and third constant width are substantially the same, and wherein the second angle and the third angle are substantially the same.

13. The AMR sensor of claim 11, wherein, the first barber pole portion is between the second and third barber pole portions.

14. The AMR sensor of claim 11, wherein a combined length of resistive portions of the first barber pole portion is between 1.2 and 40 times greater than a combined length of resistive portions of the second barber pole portion and third barber pole portion.

15. The AMR sensor of claim 9, wherein the strip of magnetoresistive material further comprises a section of varying width connecting the first barber pole portion and second barber pole portion, and wherein the AMR sensor further comprises a conductive material covering the section of varying width.

16. The AMR sensor of claim 9, further comprising a tapered end adjacent the second barber pole portion.

17. An anisotropic-magnetoresistive (AMR) sensor with improved linearity, comprising:
an input signal terminal;
an output signal terminal; and
coupled between the input signal terminal and output signal terminal, a continuous strip of magnetoresistive material configured to provide a linear change in resistance as a function of applied external magnetic field by superimposing a positive change in resistance as a function of the applied external magnetic field and a negative change in resistance as a function of the applied external magnetic field, wherein:

the strip of magnetoresistive material comprises a first section having a first constant width and a second section having a second constant width greater than the first constant width,
a first conductive strip extends over the first constant width of the first section at a first angle relative to the first section and a second conductive strip extends over the second constant width of the second section at a second angle, opposite the first angle, and
the strip of magnetoresistive material is configured such that a supply voltage is applied to an input end of the second section, and an output end of the second section is positioned between the input end of the second section and the first section.

18. The AMR sensor of claim 17, wherein the strip of magnetoresistive material comprises means for providing a linear change in resistance as a function of applied external magnetic field by superimposing a positive change in resistance as a function of the applied external magnetic field and a negative change in resistance as a function of the applied external magnetic field, wherein a slope of the positive change in resistance as a function of applied external magnetic field has a different absolute value than a slope of the negative change in resistance as a function of applied external magnetic field.

19. The AMR sensor of claim 18, wherein the strip of magnetoresistive material comprises multiple barber-pole AMR sensors.

20. The AMR sensor of claim 18, wherein the strip of magnetoresistive material comprises multiple pairs of barber-pole AMR sensors having opposing barber pole configurations.

* * * * *